US012713520B2

(12) United States Patent
Farkas et al.

(10) Patent No.: US 12,713,520 B2
(45) Date of Patent: Aug. 18, 2026

(54) WIDE-BAND COMMON MODE REDUCTION IN HIGH SPEED DIFFERENTIAL TRACES

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

(*) Notice: Subject to any disclaimer, the term of this patent is extended or adjusted under 35 U.S.C. 154(b) by 241 days.

(21) Appl. No.: 18/741,457

(22) Filed: Jun. 12, 2024

(65) Prior Publication Data

US 2025/0386424 A1 Dec. 18, 2025

(51) Int. Cl.
*H05K 1/02* (2006.01)
*H01P 5/18* (2006.01)

(52) U.S. Cl.
CPC ........... *H05K 1/0245* (2013.01); *H01P 5/184* (2013.01); *H05K 1/025* (2013.01); *H05K 2201/09236* (2013.01)

(58) Field of Classification Search
CPC .................................... H01P 5/18; H05K 1/02
See application file for complete search history.

(56) References Cited

U.S. PATENT DOCUMENTS 6,850,423 B2 2/2005 Lanni
7,315,592 B2 1/2008 Tsatsanis et al.
7,459,200 B2 * 12/2008 McCall ................ H05K 1/0248 428/209
8,638,150 B2 * 1/2014 Kim .................... H04L 25/0276 327/170
8,798,204 B2 * 8/2014 Chen ................... H04L 25/0276 375/257
10,797,682 B2 * 10/2020 Yun ...................... H03H 11/245
10,887,134 B2 * 1/2021 Miyashita ............... G06F 1/105
11,057,987 B2 * 7/2021 Lou ...................... H05K 1/0248
12,207,391 B2 * 1/2025 Liu ...................... H05K 1/0245
12,506,455 B2 * 12/2025 Nguyen .................. H01P 3/026
2016/0285148 A1 9/2016 Ao et al.

* cited by examiner

*Primary Examiner* — Andrea Lindgren Baltzell
*Assistant Examiner* — Alan Wong
(74) *Attorney, Agent, or Firm* — Larson Newman, LLP

(57) ABSTRACT

A printed circuit board includes a pair of differential signal traces, a first rejection trace between the positive signal trace and the negative signal trace, and a second rejection trace between the positive signal trace and the negative signal trace. The differential signal traces include a positive signal trace and a negative signal trace. The first rejection trace detects a first common mode (CM) signal present on the differential signal traces, and reduces the first CM signal on the differential signal traces. The second rejection trace detects a second CM signal present on the differential signal traces, and reduces the second CM signal on the differential signal traces. The first CM signal is centered at a first frequency, and the second CM signal is centered at a second frequency.

20 Claims, 4 Drawing Sheets

WIDE-BAND COMMON MODE REDUCTION IN HIGH SPEED DIFFERENTIAL TRACES

RELATED APPLICATION

This application is related to U.S. patent application Ser. No. 18/741,418, entitled "COMMON MODE REDUCTION IN HIGH SPEED DIFFERENTIAL TRACES," filed Jun. 12, 2024, which is hereby incorporated by reference.

This application is related to U.S. patent application Ser. No. 18/741,493, entitled "COMMON MODE DETECTION IN HIGH SPEED DIFFERENTIAL TRACES," filed Jun. 12, 2024, which is hereby incorporated by reference.

FIELD OF THE DISCLOSURE

This disclosure generally relates to information handling systems, and more particularly relates to reducing wide-band common mode noise in high-speed differential traces in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include a pair of differential signal traces, a first rejection trace between the positive signal trace and the negative signal trace, and a second rejection trace between the positive signal trace and the negative signal trace. The differential signal traces may include a positive signal trace and a negative signal trace. The first rejection trace may detect a first common mode (CM) signal present on the differential signal traces, and reduce the first CM signal on the differential signal traces. The second rejection trace may detect a second CM signal present on the differential signal traces, and reduce the second CM signal on the differential signal traces. The first CM signal may be centered at a first frequency, and the second CM signal may be centered at a second frequency.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1A:
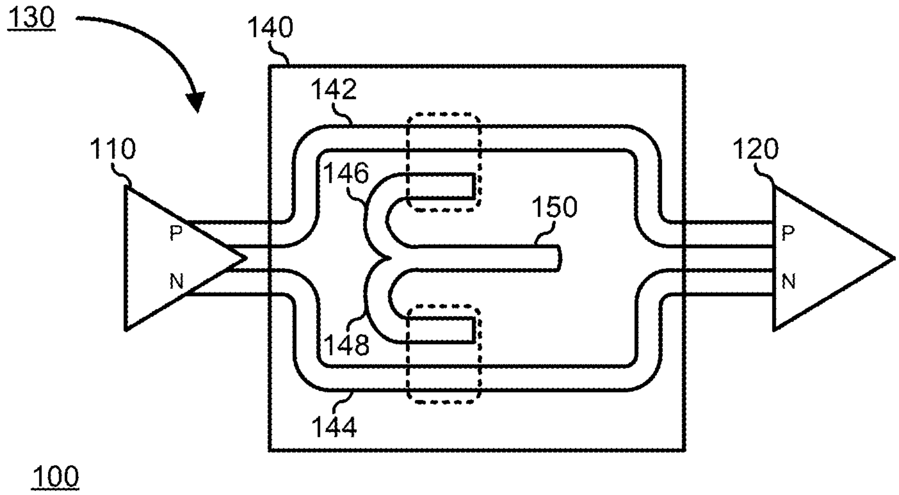
FIGS. 1A and 1B illustrate differential signal interfaces according to an embodiment of the present disclosure.
Figure 1B:
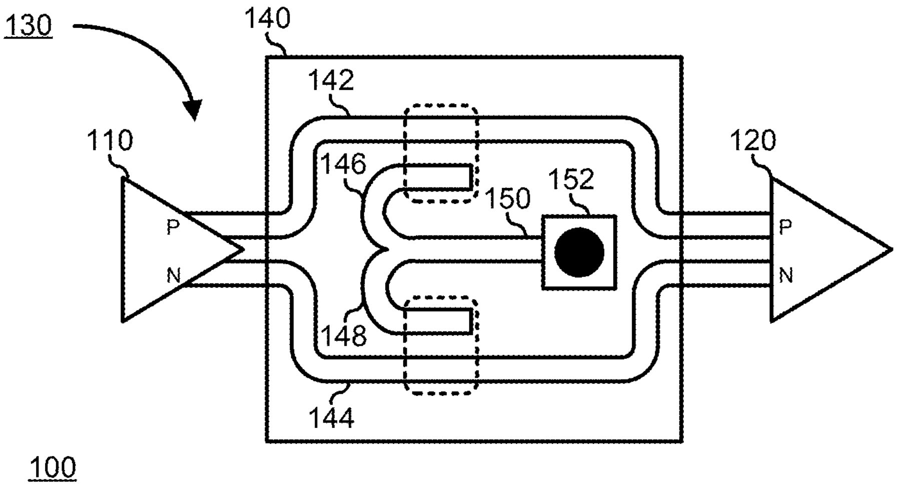

FIGS. 1A and 1B illustrate a data communication interface 100. Interface 100 is configured to transmit data from a transmitter 110 to a receiver 120 via differential signal traces 130. Transmitter 110 may be understood to be located in a first device, receiver 120 to be located in a second device, and traces 130 to provide a differential signal connection between the devices. As such, interface 100 may represent half of a high-speed differential signal data communication lane that includes a complimentary interface (not illustrated) that includes a transmitter in the second device, a receiver in the first device, and differential signal traces between the transmitter and the receiver. An example of a high-speed differential signal data communication lane may include a Peripheral Component Interconnect-Express (PCIe) lane, a Serial ATA (SATA) interface, or the like.

Data communication interfaces such as interface 100 are typically understood to provide a high degree of common mode (CM) noise immunity due to the differential signaling on the traces. However, in reality, imperfections in the implementation of the interface can introduce skews between the positive (P) signal and the negative (N) signal, resulting in an induced CM signal on interface 100. Such imperfections may include unbalanced output buffers, fiber weave effect in the printed circuit board (PCB) laminate, mismatched lengths in the traces, mismatched via capacitances due to PCB fabrication tolerances, or the like. A CM signal may further be introduced into the interface due to cross-talk coupling to adjacent interfaces. The induced CM signal could cause electromagnetic interference (EMI) effects in adjacent interfaces, and may disturb receiver timings.

Thus it may be important for the manufacturer or operator of an information handling system to better understand the CM signal present on the interfaces. Typically, the CM signal on an interface is measured by connecting a load board to each high-speed data communication interface connector. Such a load board can be instrumented by providing a test connector, such as a SMA connector or the like, for each differential signal trace, providing a test signal on the interface, and measuring the CM signal at the test connector. However, it has been understood by the inventors of the current disclosure that the addition of a load board may not provide satisfactory measurements of the CM signal because the load board represents an artificial environment that differs from the run time conditions.

Returning to FIG. 1A, traces 130 include a CM detection block 140. CM detection block 140 represents a structure patterned on the PCB that includes interface 100 that is designed to measure the CM noise on traces 130. CM detection block 140 includes a positive signal trace 142 and a negative signal trace 144. Here, signal traces 142 and 144 are formed to surround a detection trace that couples to the signals carried on the signal traces and produces a CM signal output. In particular, the detection trace includes a positive signal directional coupler trace 146, a negative signal directional coupler trace 148, and an output trace 150. Positive signal directional coupler trace 146 is placed on the PCB proximate to positive signal trace 142 and is electromagnetically coupled to the positive signal trace, as illustrated by the dashed box between the positive signal trace and the positive signal directional coupler trace. Likewise, negative signal directional coupler trace 148 is placed on the PCB proximate to negative signal trace 144 and is electromagnetically coupled to the negative signal trace, as illustrated by the dashed box between the negative signal trace and the negative signal directional coupler trace. The positive and negative signal directional coupler traces 146 and 148 may operate as quarter-wave couplers and are coupled in a summing node to form output trace 150. Thus it may be understood that the lengths of positive and negative signal directional couplers 146 and 148 can be provided as the length of a quarter-wave on the PCB medium at a desired center frequency.

Note that, in coupling positive and negative signal directional couplers 146 and 148 to form output trace 150, the various traces may be designed with a geometry that ensures that the impedances of all traces remain at a desired impedance level. For example, methods for providing coupled power combiners on a PCB are known in the art, and will not be further described herein, except as may be needed to illustrate the current embodiments. Here, the signal on positive signal trace 142 (P) can be described as:

$$P = DMp + C; \quad \text{Equation 1}$$

the signal on negative signal trace 144 (N) can be described as:

$$N = DMn + C; \quad \text{Equation 2}$$

and the signal on output trace 150 (S) can be described as:

$$S = k*P + k*N = 2*k*C; \quad \text{Equation 3}$$

where DMp is the positive differential signal, DMn is the negative differential signal, C is the CM signal on traces 142 and 144, and k is a coupling factor.

A test probe can be connected at output trace 150 to measure the CM signal on interface 100. CM detection block 140 thus represents a building block for detection and measurement of the CM signal on multiple interfaces similar to interface 100. Thus a load board or motherboard can be fabricated with multiple CM detection blocks similar to CM detection block 140, giving easy access to measurement test points, as needed or desired. In particular, where transmitter 110 resides on a first PCB and receiver 120 resides on a second PCB, and where the PCBs are connected by a connector, CM detection block 140 can be fabricated on a load board, i.e., a PCB that does not include a receiver. Note here that such a load board may not represent an ideal test condition due to the absence of a receiver circuit. In another case, where interface 100 represents an interface where both transmitter 110 and receiver 120 reside on a common PCB, such as a motherboard, CM detection block 140 can be fabricated on the PCB. Here, the inclusion of CM detection block 140 may provide real-time measurement of the CM signal in a running information handling system, as needed or desired.

Note further that CM detection block 140 is tunable to focus on the CM signal present on interface 100 at a particular frequency of interest. For example, by lengthening positive signal directional coupler trace 146 and negative signal directional coupler trace 148, the center frequency of the CM signal will be a relatively low frequency. Likewise, by shortening positive signal directional coupler trace 146 and negative signal directional coupler trace 148, the center frequency of the CM signal will be a relatively high frequency. In a particular embodiment, the profiles signal directional coupler trace 146 and 148, can be modified to obtain better coupling performance. For example, by tapering the profile of signal directional coupler trace 146 and 148, the Q factor of the coupler can be improved.

FIG. 1B illustrates interface 100 with the addition of a test connection port 152 to output trace 150. In this way, measurements of the CM signal can be obtained by simply connecting a complimentary test connector to test connection port 152. An example of test connection port 152 may include a SMA connector or the like. Here, the manufacturer of the PCB that includes CM detection block 140 has wide flexibility as to whether or not to populate the CM detection block with test connection port 152. For example, in early stages of the PCB lifecycle, such as when the design is being verified, CM detection block 140 may be populated with test connection port 152 for easy access to measure the CM signal on interface 100. Then, when the PCB enters a volume production stage, CM detection block 140 can be fabricated without the inclusion of test connection port 152 as a cost savings. Finally, if a volume production PCB develops problems, CM detection block 140 can be populated with test connection port 152 to aid in debugging the problems.

In a particular embodiment, CM detection block 140 is fabricated such that each of positive signal trace 142, negative signal trace 144, positive signal directional coupler trace 146, negative signal directional coupler trace 148, and output trace 150 are formed on a surface of the PCB that includes interface 100. For example, positive signal trace 142, negative signal trace 144, positive signal directional coupler trace 146, negative signal directional coupler trace 148, and output trace 150 may be formed as metal microstrip traces on a PCB dielectric, as needed or desired. In another embodiment, CM detection block 140 is fabricated such that each of positive signal trace 142, negative signal trace 144, positive signal directional coupler trace 146, negative signal directional coupler trace 148, and output trace 150 are formed on an inner metal layer of the PCB that includes interface 100. For example, positive signal trace 142, negative signal trace 144, positive signal directional coupler trace 146, negative signal directional coupler trace 148, and output trace 150 may be formed as metal strip line traces on an inner metal layer between PCB dielectric layers, as needed or desired.

Figure 2:
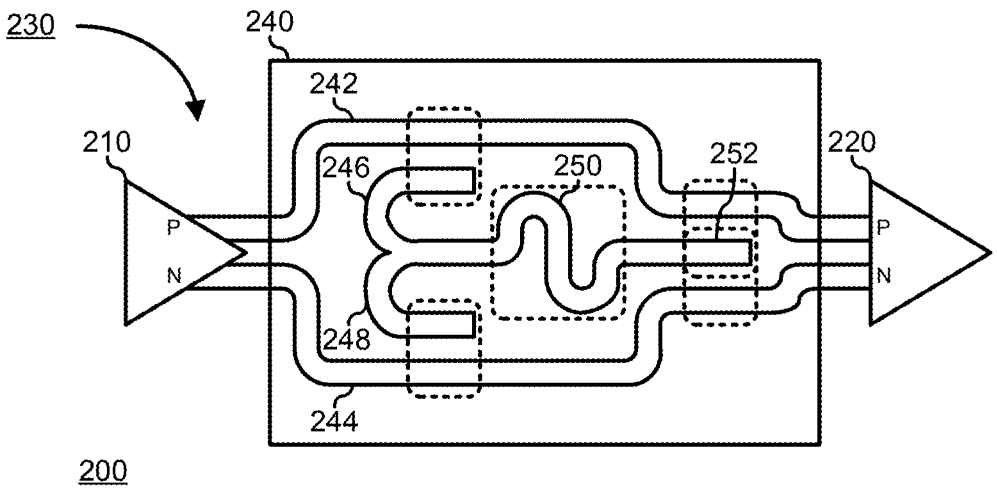
FIG. 2 illustrates a differential signal interfaces according to an embodiment of the present disclosure.

FIG. 2 illustrates a data communication interface 200 similar to data communication interface 100. As such, interface 200 is configured to transmit data from a transmitter 210 to a receiver 220 via differential signal traces 230, where the transmitter may be understood to be located in a first device, the receiver to be located in a second device, and the traces to provide a differential signal connection between the devices. Traces 230 include a CM rejection block 240. CM rejection block 240 represents a structure patterned on the PCB that includes interface 200 that is designed to measure the CM noise on traces 230 and to feed a complimentary CM signal back to traces 230. CM rejection block 240 includes a positive signal trace 242 and a negative signal trace 244. Here, signal traces 242 and 244 are formed to surround a detection trace that couples to the signals carried on the signal traces and produces a CM signal output. In particular, the detection trace includes a positive signal directional coupler trace 246, a negative signal directional coupler trace 248, a delay trace 250, and a feedback trace 252. Signal directional coupler traces 246 and 248 are placed on the PCB proximate to associated signal traces 242 and 244 to measure the CM signal as described above with respect to Equations 1-3.

Delay trace 250 is provided with a length designed to add a 180 degree phase shift to the CM noise, and feedback trace 252 is located proximate to both signal traces 242 and 244 to couple the delayed CM signal back into the signal traces, as illustrated by the dashed boxes between the positive and negative signal traces and the feedback trace. In this way, the detected CM signal is reduced on interface 200. Note that CM rejection block 240 is tunable to focus on the CM signal present on interface 200 at a particular frequency of interest. For example, by lengthening positive signal directional coupler trace 246, negative signal directional coupler trace 248, and feedback trace 252, the center frequency of the CM signal will be a relatively low frequency. Likewise, by shortening positive signal directional coupler trace 246, negative signal directional coupler trace 248, and feedback trace 252, the center frequency of the CM signal will be a relatively high frequency. In a particular embodiment, the profiles signal directional coupler trace 246 and 248, can be modified to obtain better coupling performance. For example, by tapering the profile of signal directional coupler trace 246 and 248, the Q factor of the coupler can be improved. In a particular embodiment, CM rejection block 240 is placed more proximately to receiver 220 than to transmitter 210, in order to provide a clean input to the receiver.

In a particular embodiment, CM rejection block 240 is fabricated such that each of positive signal trace 242, negative signal trace 244, positive signal directional coupler trace 246, negative signal directional coupler trace 248, delay trace 250, and feedback trace 252 are formed on a surface of the PCB that includes interface 200. For example, positive signal trace 242, negative signal trace 244, positive signal directional coupler trace 246, negative signal directional coupler trace 248, delay trace 250, and feedback trace 252 may be formed as metal microstrip traces on a PCB dielectric, as needed or desired. In another embodiment, CM rejection block 240 is fabricated such that each of positive signal trace 242, negative signal trace 244, positive signal directional coupler trace 246, negative signal directional coupler trace 248, delay trace 250, and feedback trace 252 are formed on an inner metal layer of the PCB that includes interface 200. For example, positive signal trace 242, negative signal trace 244, positive signal directional coupler trace 246, negative signal directional coupler trace 248, delay trace 250, and feedback trace 252 may be formed as metal strip line traces on an inner metal layer between PCB dielectric layers, as needed or desired. Note that because signal propagation is typically faster in a microstrip as compared to a strip line, the respective lengths of positive signal directional coupler trace 246, negative signal directional coupler trace 248, delay trace 250, and feedback trace 252 in a microstrip application may need to be longer than their respective counterparts in a strip line application in order to maintain the same center frequency.

Figure 3:
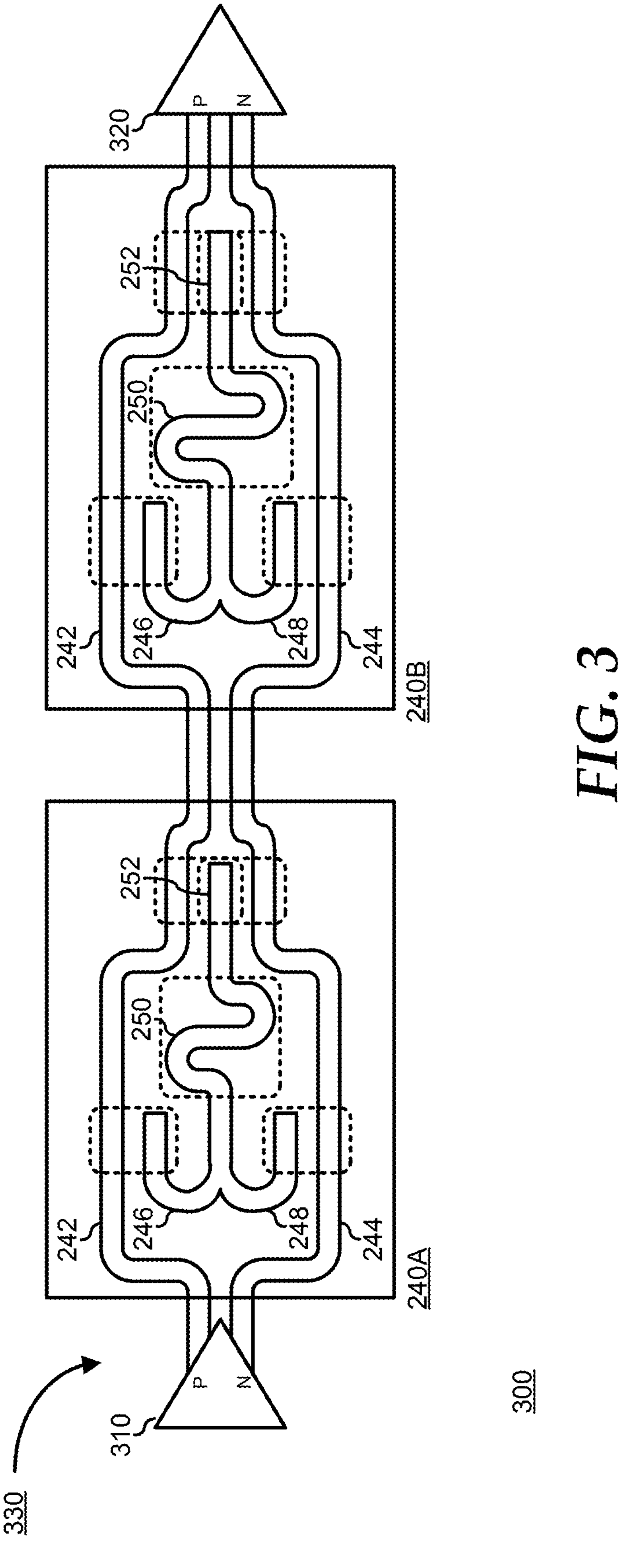
FIG. 3 illustrates a differential signal interfaces according to an embodiment of the present disclosure.

FIG. 3 illustrates a data communication interface 300 similar to data communication interfaces 100 and 200. As such, interface 300 is configured to transmit data from a transmitter 310 to a receiver 320 via differential signal traces 330, where the transmitter may be understood to be located in a first device, the receiver to be located in a second device, and the traces to provide a differential signal connection between the devices. Traces 330 include two CM rejection blocks 240A and 240B similar to CM rejection block 240. As such, CM rejection blocks 240A and 240B represents structures patterned on the PCB that includes interface 300 that is designed to measure the CM noise on traces 330 and to feed a complimentary CM signal back to traces 330. However, here, each one of CM rejection blocks 240A and 240B are configured to measure the CM noise and feed back the complimentary CM signals at different center frequencies to provide wide-band CM noise rejection on interface 300.

CM rejection blocks 240A and 240B each include a positive signal trace 242 and a negative signal trace 244. Here, signal traces 242 and 244 are formed to surround a detection trace that couples to the signals carried on the signal traces and produces a CM signal output. In particular, the detection trace includes a positive signal directional coupler trace 246, a negative signal directional coupler trace 248, a delay trace 250, and a feedback trace 252. Signal directional coupler traces 246 and 248 are placed on the PCB proximate to associated signal traces 242 and 244 to measure the CM signal as described above with respect to Equations 1-3. However, CM rejection block 240A differs from CM rejection block 240B in that the lengths of their respective traces are different to tune the respective CM rejection blocks to different center frequencies. Thus in CM directional coupler 240A, signal directional coupler traces 246 and 248, delay trace 250, and feedback trace 252 are shorter than their associated traces in CM directional coupler 240B. In this way, CM directional coupler 240A operates at a higher center frequency than CM directional coupler 240B. Note that one or more additional CM directional coupler, centered on one or more additional center frequencies, may be added as needed or desired.

In a particular embodiment, one or more CM rejection blocks 240A and 240B are fabricated such that each of positive signal trace 242, negative signal trace 244, positive signal directional coupler trace 246, negative signal directional coupler trace 248, delay trace 250, and feedback trace 252 are formed on a surface of the PCB that includes interface 200. For example, positive signal trace 242, negative signal trace 244, positive signal directional coupler trace 246, negative signal directional coupler trace 248, delay trace 250, and feedback trace 252 may be formed as metal microstrip traces on a PCB dielectric, as needed or desired. In another embodiment, one or more of CM rejection blocks 240A and 240B are fabricated such that each of positive signal trace 242, negative signal trace 244, positive signal directional coupler trace 246, negative signal directional coupler trace 248, delay trace 250, and feedback trace 252 are formed on an inner metal layer of the PCB that includes interface 200. For example, positive signal trace 242, negative signal trace 244, positive signal directional coupler trace 246, negative signal directional coupler trace 248, delay trace 250, and feedback trace 252 may be formed as metal strip line traces on an inner metal layer between PCB dielectric layers, as needed or desired. As noted above, the respective lengths of positive signal directional coupler trace 246, negative signal directional coupler trace 248, delay trace 250, and feedback trace 252 in a microstrip application may need to be longer than their respective counterparts in a strip line application in order to maintain the same center frequency.

Figure 4:
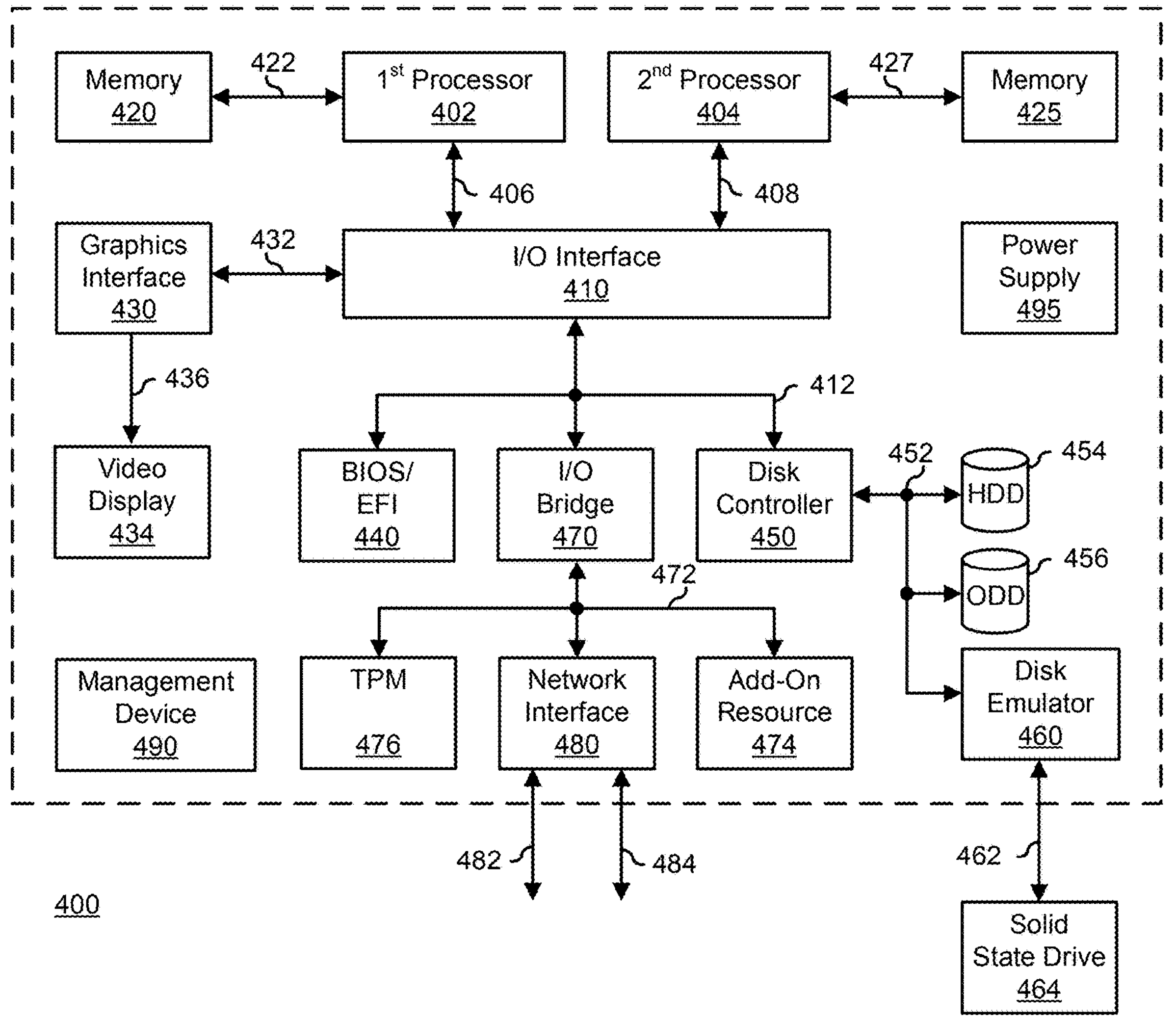
FIG. 4 is a block diagram illustrating a generalized information handling system according to another embodiment of the present disclosure.

FIG. 4 illustrates a generalized embodiment of an information handling system 400 similar to information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 where peripheral interface 472 and the I/O channel are of the same type, and the I/O bridge translates information from a format suitable to the I/O channel to a format suitable to the peripheral channel 472 where they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 where the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:

a pair of differential signal traces including a positive signal trace and a negative signal trace;

a first rejection trace between the positive signal trace and the negative signal trace, the first rejection trace configured to detect a first common mode (CM) signal present on the differential signal traces and to reduce the first CM signal on the differential signal traces, wherein the first CM signal is centered at a first frequency; and a second rejection trace between the positive signal trace and the negative signal trace, the second rejection trace configured to detect a second common mode (CM) signal present on the differential signal traces and to reduce the second CM signal on the differential signal traces, wherein the second CM signal is centered at a second frequency.

2. The printed circuit board of claim 1, wherein:

the first rejection trace includes a first positive signal directional coupler trace electromagnetically coupled to the positive signal trace and a first negative signal directional coupler trace electromagnetically coupled to the negative signal trace; and the second rejection trace includes a second positive signal directional coupler trace electromagnetically coupled to the positive signal trace and a second negative signal directional coupler trace electromagnetically coupled to the negative signal trace.

3. The printed circuit board of claim 2, wherein:

the first positive signal directional coupler trace and the first negative signal directional coupler trace are configured to detect a first CM noise signal on the differential signal traces, the first CM noise signal being centered at the first frequency; and the second positive signal directional coupler trace and the second negative signal directional coupler trace are configured to detect a second CM noise signal on the differential signal traces, the second CM noise signal being centered at the second frequency.

4. The printed circuit board of claim 3, wherein:
the first positive signal directional coupler trace and the first negative signal directional coupler trace are coupled to a first delay trace; and
the second positive signal directional coupler trace and the second negative signal directional coupler trace are coupled to a second delay trace.

5. The printed circuit board of claim 4, wherein:
the first delay trace is configured to provide a first 180 degree phase shift to the first CM noise signal; and
the second delay trace is configured to provide a second 180 degree phase shift to the second CM noise signal.

6. The printed circuit board of claim 5, wherein:
the first delay trace is coupled to a first feedback trace; and
the second delay trace is coupled to a second feedback trace.

7. The printed circuit board of claim 6, wherein:
the first feedback trace is electromagnetically coupled to the positive signal trace and the negative signal trace; and
the second feedback trace is electromagnetically coupled to the positive signal trace and the negative signal trace.

8. The printed circuit board of claim 7, wherein:
the first feedback trace couples the first phase shifted CM noise signal to reduce the first CM signal on the differential signal traces at the first frequency; and
the second feedback trace couples the second phase shifted CM noise signal to reduce the second CM signal on the differential signal traces at the second frequency.

9. The printed circuit board of claim 1, wherein the pair of differential traces, and the first and second rejection traces are formed on a surface of the printed circuit board.

10. The printed circuit board of claim 1, wherein the pair of differential traces, and the first and second rejection trace are formed on a metal layer between two dielectric layers of the printed circuit board.

11. A method, comprising:
providing, on a printed circuit board, a pair of differential signal traces including a positive signal trace and a negative signal trace;
providing, between the positive signal trace and the negative signal trace, a first rejection trace;
detecting, by the first rejection trace, a first common mode (CM) signal present on the differential signal traces, wherein the first CM signal is centered at a first frequency;
reducing, by the first rejection trace, the first CM signal on the differential signal traces;
providing, between the positive signal trace and the negative signal trace, a second rejection trace;
detecting, by the second rejection trace, a second common mode (CM) signal present on the differential signal traces, wherein the second CM signal is centered at a second frequency;
reducing, by the second rejection trace, the second CM signal on the differential signal traces.

12. The method of claim 11, wherein:
the first rejection trace includes a first positive signal directional coupler trace electromagnetically coupled to the positive signal trace and a first negative signal directional coupler trace electromagnetically coupled to the negative signal trace; and
the second rejection trace includes a second positive signal directional coupler trace electromagnetically coupled to the positive signal trace and a second negative signal directional coupler trace electromagnetically coupled to the negative signal trace.

13. The method of claim 12, wherein:
the first positive signal directional coupler trace and the first negative signal directional coupler trace are configured to detect a first CM noise signal on the differential signal traces, the first CM noise signal being centered at the first frequency; and
the second positive signal directional coupler trace and the second negative signal directional coupler trace are configured to detect a second CM noise signal on the differential signal traces, the second CM noise signal being centered at the second frequency.

14. The method of claim 13, wherein:
the first positive signal directional coupler trace and the first negative signal directional coupler trace are coupled to a first delay trace; and
the second positive signal directional coupler trace and the second negative signal directional coupler trace are coupled to a second delay trace.

15. The method of claim 14, wherein:
the first delay trace is configured to provide a first 180 degree phase shift to the first CM noise signal; and
the second delay trace is configured to provide a second 180 degree phase shift to the second CM noise signal.

16. The method of claim 15, wherein:
the first delay trace is coupled to a first feedback trace; and
the second delay trace is coupled to a second feedback trace.

17. The method of claim 16, wherein:
the first feedback trace is electromagnetically coupled to the positive signal trace and the negative signal trace; and
the second feedback trace is electromagnetically coupled to the positive signal trace and the negative signal trace.

18. The method of claim 17, wherein:
the first feedback trace couples the first phase shifted CM noise signal to reduce the first CM signal on the differential signal traces at the first frequency; and
the second feedback trace couples the second phase shifted CM noise signal to reduce the second CM signal on the differential signal traces at the second frequency.

19. The method of claim 11, wherein the pair of differential traces, and the first and second rejection traces are formed on at least one of a surface of the printed circuit board, and on a metal layer between two dielectric layers of the printed circuit board.

20. A data communication interface, comprising:
a transmitter;
a receiver;
a pair of differential signal traces including a positive signal trace and a negative signal trace;
a first rejection trace between the positive signal trace and the negative signal trace, the first rejection trace configured to detect a first common mode (CM) signal present on the differential signal traces and to reduce the first CM signal on the differential signal traces, wherein the first CM signal is centered at a first frequency; and
a second rejection trace between the positive signal trace and the negative signal trace, the second rejection trace configured to detect a second common mode (CM) signal present on the differential signal traces and to reduce the second CM signal on the differential signal traces, wherein the second CM signal is centered at a second frequency.

* * * * *